United States Patent [19]

Guo et al.

[11] Patent Number: 5,349,612
[45] Date of Patent: Sep. 20, 1994

[54] DIGITAL SERIALIZER AND TIME DELAY REGULATOR

[75] Inventors: Bin Guo, Cupertino, Calif.; James J. Kubinec, Reno, Nev.

[73] Assignee: Advanced Micro Devices, Inc., Sunnyvale, Calif.

[21] Appl. No.: 901,312

[22] Filed: Jun. 19, 1992

[51] Int. Cl.⁵ .............. H04L 7/00; H04L 25/36; H04L 25/40; H03D 3/24
[52] U.S. Cl. .................. 375/118; 375/119; 328/155; 307/269; 307/595
[58] Field of Search .......... 328/63, 155; 307/262, 307/269, 590, 592, 593, 595, 596, 597, 600, 601, 602, 603, 606; 375/118, 119, 120; 370/112, 113

[56] References Cited

U.S. PATENT DOCUMENTS

| | | | |
|---|---|---|---|
| 4,763,327 | 8/1988 | Fontaine et al. | |
| 4,805,195 | 2/1989 | Keegan | 375/118 |
| 4,899,071 | 2/1990 | Morales | 307/590 |
| 5,109,394 | 4/1992 | Hjerpe et al. | 375/119 |
| 5,146,121 | 9/1992 | Searles et al. | 307/262 |
| 5,159,205 | 10/1992 | Gorecki et al. | 307/595 |

FOREIGN PATENT DOCUMENTS 0146236  6/1985  European Pat. Off.
8909520  10/1989  European Pat. Off.

Primary Examiner—Stephen Chin
Assistant Examiner—Duane Kobayashi
Attorney, Agent, or Firm—Gerald Fisher

[57] ABSTRACT

A self calibrated time delay circuit including a plurality of serially connected unit delay cells each having an output tap which is selectable, a registration means for simultaneously determining the status of each output node of each of the unit delay cells, combinatorial and sequential logic units for analyzing said registration means and sending error correction commands to an up/down controller, said up down controller providing a command code for controlling the delay of each said unit delay by selecting which tap is output from said unit delay cell.

12 Claims, 7 Drawing Sheets

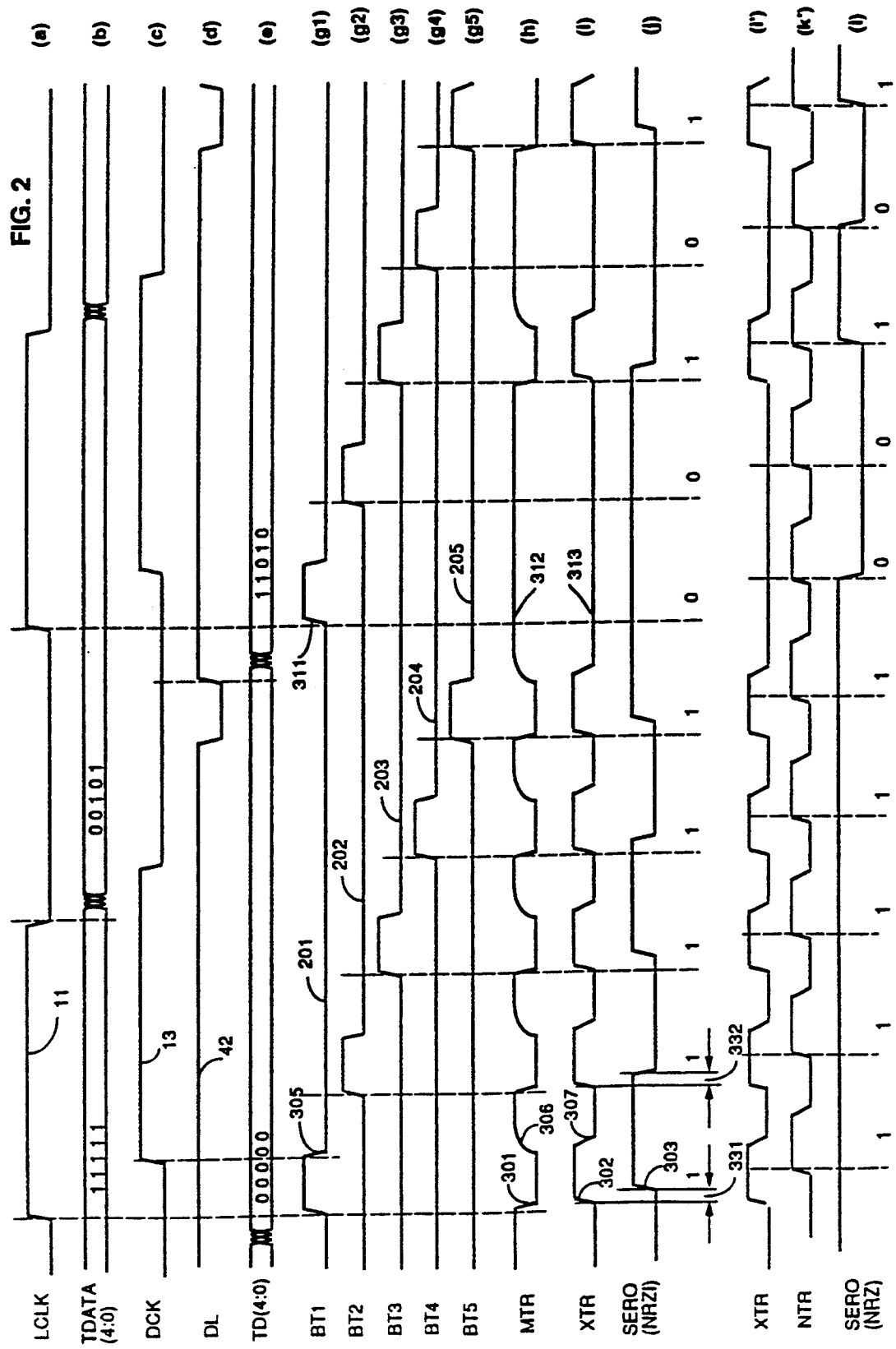

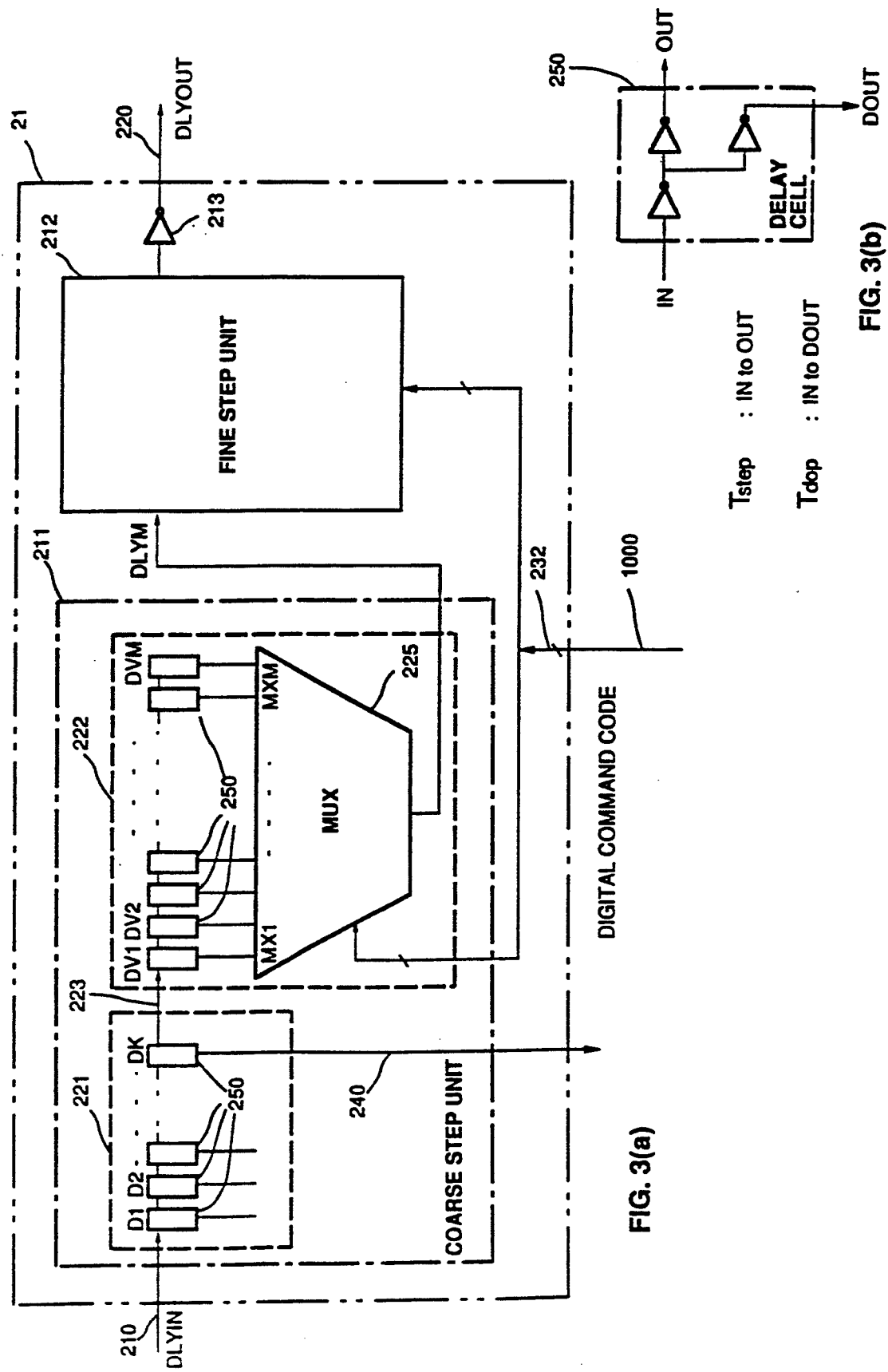

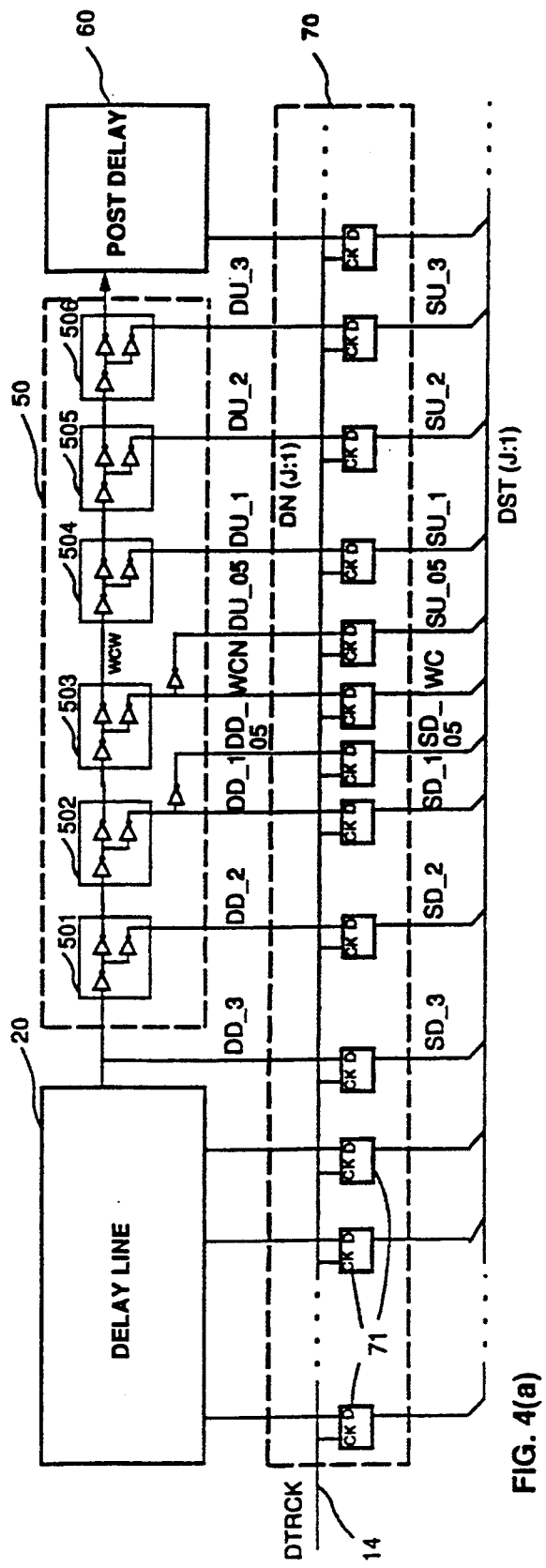
FIG. 4(a)
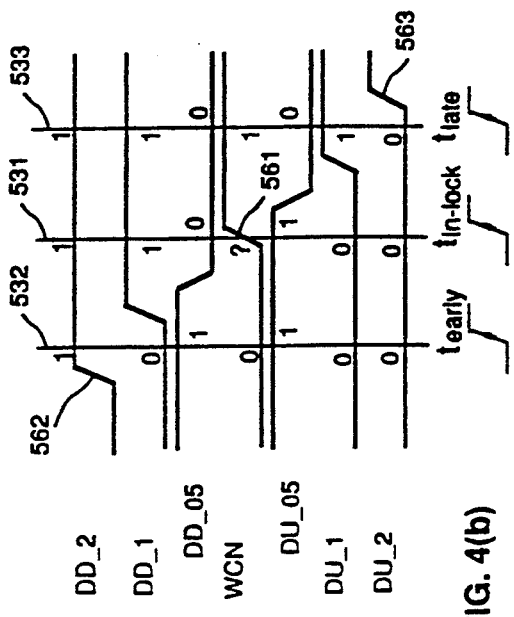
FIG. 4(b)
FIG. 4(c)

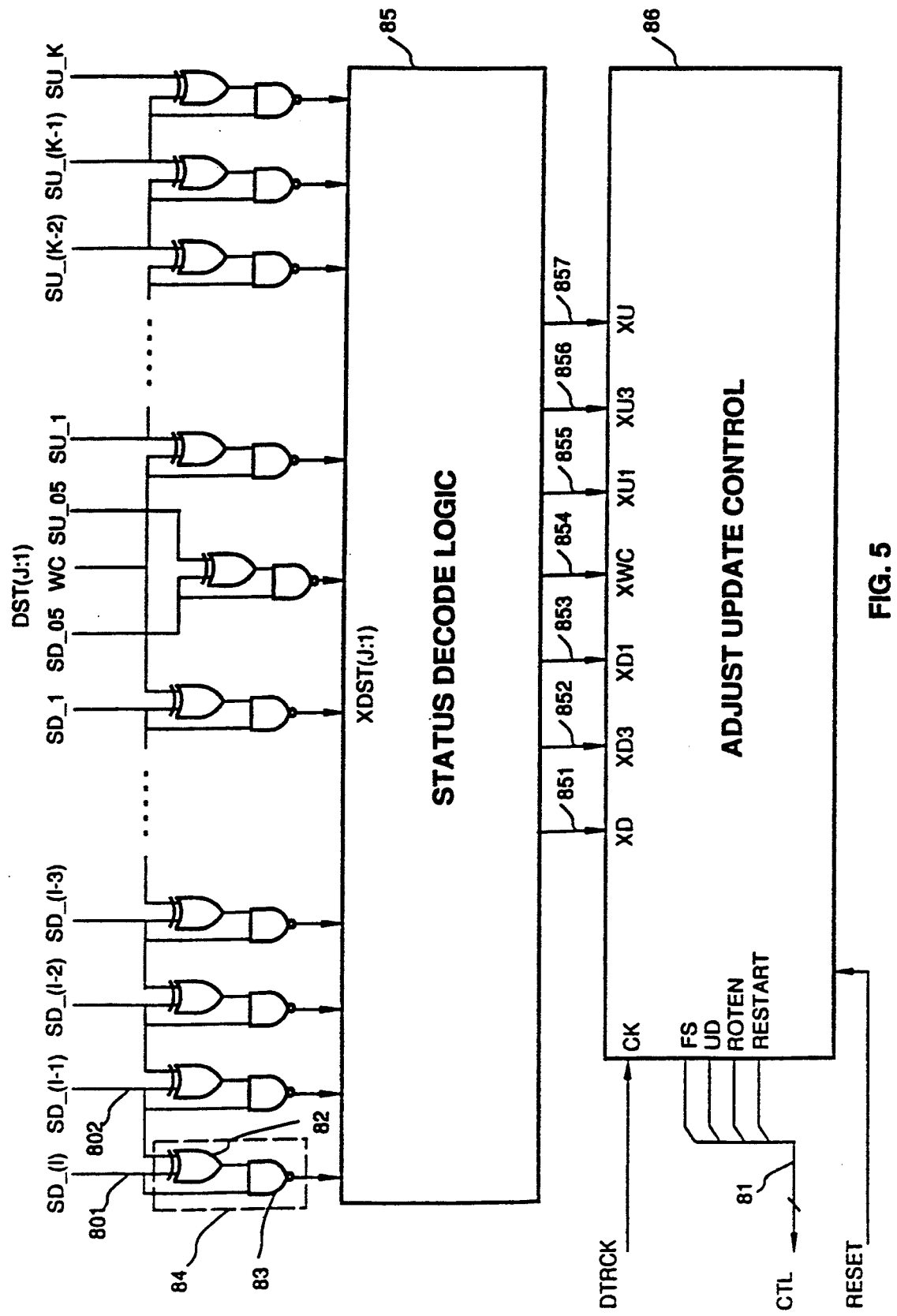

DIGITAL SERIALIZER AND TIME DELAY REGULATOR

FIELD OF THE INVENTION

This invention relates to digital transmission links and particularly to all digital methods and apparatus for data serialization and time delay regulation.

RELATED APPLICATIONS

The applicant has simultaneously filed the below listed patent applications, each of which relate to aspects of a high data rate digital data transmission and recovery system, said applications are incorporated herein by reference:

1. "Digital Jitter Correction Method and Signal Preconditioner," Ser. No. 07/901,360; filing date Jun. 19, 1992; inventor Bin Guo and Michael Behrin.
2. "Digital Data Recovery using Delay Time Rulers," Ser. No. 07/901,335; filing date Jun. 19, 1992; inventor Bin Guo.

BACKGROUND OF THE INVENTION

In data communication systems, data at the transmitter is usually serialized before delivery to the transmission media of the serial link. Phase Locked Loops (PLL) are most frequently employed to produce the bit clock from the local reference clock running at the parallel data frequency (byte rate) for transmitting data at a higher frequency (bit rate). To serialize N-bit parallel data, a clock running at N times the parallel data (byte) frequency is required. This N-bit parallel data is often the encoded data since channel encoding is necessary prior to transmission to overcome a variety of transmission impairments for correct data recovery to ensure reliable data transfer. The Phase Locked Loop (PLL) used in a transmitting circuit is not as demanding as those used in the receiver circuit for the obvious reason that the input to the PLL is a known frequency from a stable frequency source, however, the problems associated with phase locked loop design such as susceptibility to digital switching noise, and the requirement for analog circuitry and large capacitors and resistors is still present, making it difficult to be integrated with digital functions.

In digital implementations where constant, accurate or calibrated-on-the-fly delays are used to form various time bases, controlled delays are required. In the simultaneously filed related application, "Digital Data Recovery Using Delay Time Rulers," Ser. No. 07/901,335 filed Jun. 19, 1992, the data recovery system does not employ a phase locked loop to first extract a continuously running clock from the data, and then read the data using the recovered clock. It uses what we call discrete "Time Rulers" instead to read the incoming data. The Time Rulers are essentially cascaded digitally adjustable delay units, where each delay unit has the delay equal to half of the bit period $T_b$ of the data frequency. In the prior art, controlled delay is normally obtained by applying an analog signal as the control signal to a circuit, which is often a filtered or smoothed output from a phase detector. Traditional methods of constructing phase detectors and low pass filters are still valid for these type of delay regulations. These circuits are difficult to provide in integrated circuits and susceptible to noise. In our all digital solutions, however, a digital command control code is used to control or "select" the delay value. A finite quantizing error will therefore always exist since the selective delays are discrete values and its accuracy or resolution is determined by the minimum achievable delay values of the basic delay cells.

A need exists for digital methods and apparatus to provide precise delay, which circuits automatically detect delay variations and which generate digital corrective command code for adjusting digital controlled delays on-the-fly while the circuit is in operation, to provide calibrated or regulated time delay elements as the "time ruler" for data transmission, data recovery and various other operations.

SUMMARY OF THE INVENTION

A principle objective of the present invention is to provide apparatus and methods to generate digitally self calibrated timing delay elements for use as "time rulers" for various timing operations. A further objective of the invention is to provide a high speed data serialization circuit for transmitting data onto a serial link which does not require a phase locked loop circuit to generate a multiplexed clock running at serially transmitted bit rate.

A still further objective of the invention is to provide an all digital time delay method and scheme which does not use any analog controls, and which uses only digital command control codes for adjusting and calibrating the delays.

A still further objective is to provide a digitally self calibrating delay in connection with digital data recovery for controlling data recovery in a receiver.

A still further objective of the invention is to have a circuit which is suitable for digital integrated circuit implementation and to provide digital command control code to other circuit blocks on the same die which may require delay regulation.

We provide a method and apparatus which detects the delay variations of the delay elements in the controlled delays due to processing, temperature and power supply variations and generates digital correction command code for making proper adjustment of the controlled delays to be calibrated against the environmental changes. As a result, a "Time Ruler" or an accurate, constantly calibrated delay unit with delay value equal to half of the bit period of the serially transmitted data is obtained. In a transmitter, the N-bit parallel data provided at the byte clock rate are serialized and transmitted in intervals of 1/N of the byte period and timed by the pulses traveled in the calibrated delay line. Instead of multiplexing the byte clock to generate a bit clock, 2N identical delay units, for the total delay of N-bit periods or a byte period, are cascaded to form the delay line for both the purpose of delay detection and for the purpose of bit stream serialization timing. The delay calibration is carried out in such a way that the digital command codes to the delay units are adjusted based on the information from the delay detection logic around the point where it is found that it takes exactly one byte period for a pulse to travel through the entire delay line. At this condition, the delay units are considered to be calibrated to the said nominal value of one half bit period. The bit transmitting takes place whenever the pulse arrives at the outputs of every 2 delay units. Special care has been taken in delay unit design to ensure matched rising and falling delays so that the pulse width can be maintained while it is traveling in the long delay line. The digital command codes

BRIEF DESCRIPTION OF THE DRAWINGS

FIG. 2 is a timing diagram of signals occurring in the circuit of FIG. 1;

FIGS. 3A and 3B show a block diagram of a delay unit;

FIGS. 4A, 4B, and 4C show sampling at the detection window center of a phase detection delay circuit;

FIG. 5 shows the logic implementation of the Adjust Decision Circuit;

DETAILED DESCRIPTION OF THE INVENTION

Figure 1:
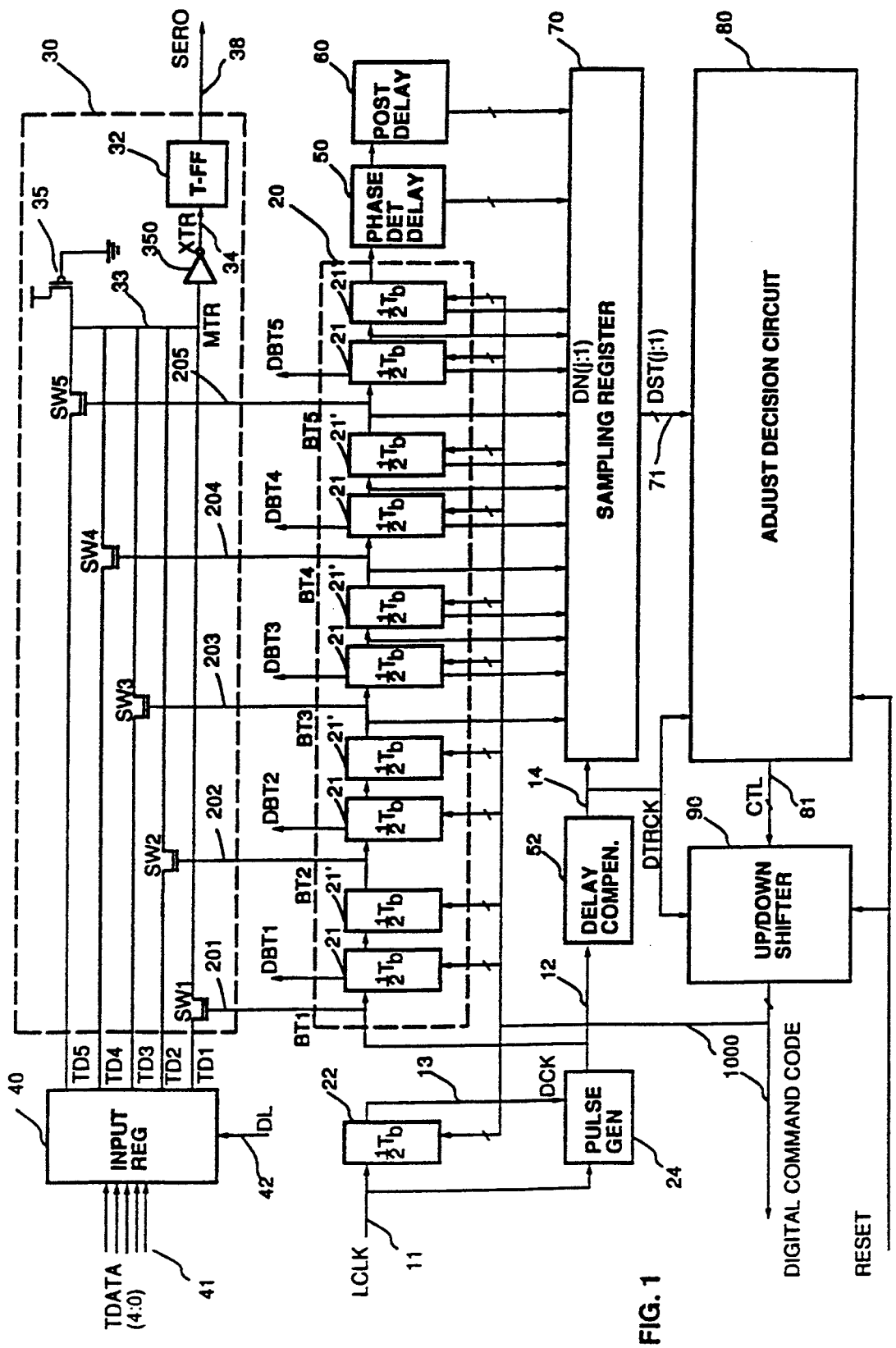
FIG. 1 is an overall block diagram of a transmitter data serializer and delay calibrating circuit in accordance with the present invention.

With reference to FIG. 1, the delay units 21 and 21' which each have a delay equal to one half of the bit period i.e. ½ Tb, where Tb is the bit period of the serially transmitted data frequency, when calibrated, are cascaded to form the detection delay line 20, outlined by dashed lines. A pair of the delay units 21(front unit) and 21' (rear unit) form the bit delay unit which will delay the time of one bit period. A single delay unit 22 is used to switch pulse generator 24 to generate a pulse at line 12 for every occurrence of a rising edge of the reference Clock LCLK, the width of which is equal to half of the bit period. The output taps from the delay line BT1 through BTN (BT5) are applied to the control terminals of the switches, or the gates of the MOS switches SW1 through SWN (SW5) in the Bit Serializer 30, after the parallel data is latched in the input register 40 and supplied to the bit serializer via line TD1 through TDN (TD5). The serialized output data is available from the output of a toggle flip-flop (TFF) 32 on line 38. The phase detection delay 50 is where the detection "window center" is located for detailed phase comparison. Delay compensation 52 compensates for the delay of the phase detection delay 50 as well as the setup time of the D flip-flops in the sampling register 70. Post-delay 60 is used for tracking the pulse when the delay of the delay units are shorter than the nominal value. Adjust decision circuit 80 analyzes the sampled status code DST(j:1)71 and makes decisions as when and how to change the controls to the Up/down Shifter 90 which updates the digital command code of the delay units for proper delay adjustment.

The operation of the circuit is easier to explain if we first describe the data serialization process assuming that the delay units are calibrated to their nominal value, and then describe how to calibrate the delay unit on-the-fly. We also assume that the parallel data are in Non-Return-to-Zero (NRZ) form, while the transmitted serial data are in Non-Return-to-Zero-Inverted-on-one (NRZI) format, in which a data bit "1" is represented by a transition and data bit "0" is represented by "no transition."

We use N=5 in connection with FIG. 1 in the following description for the purpose of simplicity in discussion. The concepts apply equally to different values of N. In the Fiber Distributed Data Interface (FDDI) standard, 4 bit (half byte) data are first encoded into a 5-bit symbol and then serialized for transmission. The local reference clock LCLK 11 runs at the symbol rate which is 1/5 of the bit rate. With reference to FIG. 1, and also to FIG. 2, the timing diagram for FIG. 1, the local reference clock LCLK running at the symbol rate is applied to the delay unit 22 and to the pulse generator 24. In the discussion that follows, the term "byte" means the coded 5-bit symbol. DCK, the delayed version of the LCLK, FIG. 2(c), is also supplied to the pulse generator 24 on line 13. The pulse generator 24 outputs pulses BT1 for every byte clock period, FIG. 2(g1), and the width of the pulse is determined by the delay value of delay unit 22 which is assumed calibrated to ½ Tb. The pulse of BT1 travels in the delay line 20 and is delayed for the interval of a bit period each time it arrives at BT2 through BT5, FIG. 2(g2–g5). DBT1 through DBT5 are taps from delay line 20 which provide delayed signals of BT1 through BT5 respectively. The functions of DBT1 through DBT5 are explained in connection with the alternate embodiment of FIG. 7. The parallel data TDATA(4:0) are latched into the input register and are valid at outputs TD1 through TD5 by the rising edge of DL, FIG. 2(d), before the rising edge of the pulse of BT1, FIG. 2(g1). Note that TD1 through TD5 are complementaries of TDATA(4:0). For the example waveform in FIG. 2b, the first byte is assumed to be an all "one" data byte which is latched for the first byte, FIG. 2(b). The latched data TD (5:1) at TD1 through TD5 are then all "0"s. Node 350 at the input of invertor 33' is pulled up to high by device 35 if none of the MOS switches SW1–SW5 are on. When the pulse of BT1 arrives, it turns on MOS switch SW1 for the duration of ½ Tb. Since output TD1, to which SW1 is connected, is low, MTR on node 33 is pulled down to low for the duration of ½ Tb, FIG. 2(h), 301. The negative transition of MTR on node 33 causes a positive transition of XTR on node 34, which in turn toggles the TFF 32 to produce an output transition of SERO at 38. (FIG. 2, 302, 303) A data bit "1" is thus sent. Half bit period later, BT1 returns to low (FIG. 2, 305) to turn SW1 off, device 35 pulls node 33 back to supply voltage or "high" to cause XTR on node 34 to return to zero (FIG. 2, 306, 307). When the pulse arrives at node 202 it turns on SW2 to cause another transition at output SERO 38 to transmit another bit "1." The whole byte of "1"s are transmitted in the same fashion. If, however, there are "0"s in the data, such as the first bit of the second byte in FIG. 2(b), there will be no transition occurred at output SERO. This is due to the fact that a data bit "0" is represented by a "1" or a "high" at TD1, when pulse of BT1 arrives to turn on SW1 (FIG. 2, 311), MTR on node 33 will remain high since TD1 is also high. No transition occurred at MTR or XTR (FIG. 2, 312, 313), and subsequently at output SERO. A data bit "0" is transmitted by means of "no transition" in the output signal. The design requirement for the TFF 32 is that a matched clock-to-rise (FIG. 2, 331) and clock-to fall (FIG. 2, 332) is desired, or duty cycle distortion type of timing jitter will be added to the transmitted data.

Next, we describe how the delay units 21 and 21' are calibrated. There are many different ways to construct the half bit delay unit 21. FIG. 3(a) shows one embodiment of the delay unit 21, which generally consists of two parts: a course step unit 211 and a fine step unit 212. The course step unit 211 is formed by two parts: a fixed-stage delay 221 and a variable-stage delay 222. There are k stages of delay cell 250 (d1 through dk) in the fixed-stage delay 221 and m stages of delay cell 250 for the variable-stage delay 222. One of the embodiments of delay cell 250 is shown in FIG. 3(b), which employs 3 invertors. The delay from IN to OUT is defined as $T_{step}$, while the delay from IN to DOUT is defined $T_{dop}$. The delay from the input of the delay cell DV1 (223) to the MUX 225 output DLYM of the variable-stage delay 222 depends on the digital command code on bus 232, which selects only one path of MUX 225 from MX1 through MXM to DLYM. Assuming that delays in MUX 225 from MX1 through MXM to the output of the MUX 225 are all the same ($T_{mux}$), and the digital command code selects the path of MX1 to DLM, or if delay stages are selected, the total delay of the course step unit 211 can then be obtained:

$$T_{coarse} = K(T_{step}) + T_{dop} + T_{mux} + i(T_{step})$$
$$= T_{int} + i(T_{step})$$
$$(i = 1, m)$$

Where $T_{int}$ is the "fixed" part of the delay unit, or its intrinsic delay. The value of parameter k and m are chosen to guarantee that under all processing and operating conditions, that the unit delay adjustable range is large enough to be able to produce the nominal delay required ($\frac{1}{2}$ Tb). $T_{step}$, the delay of the delay cell 250, is the base delay or the minimum adjustable delay of the operation which determines the resolution of the operation. $T_{int}$, on the other hand is the intrinsic delay of the delay unit which will determine the up-limit of the operating frequency. The delay unit 21 could be built by just using the "course" step unit itself if both $T_{step}$ and $T_{int}$ are satisfactory for the frequency targeted. The addition of a fine step unit 212 can be beneficial for both higher frequency operation and for lower frequency or larger frequency range operation. For the former, a even finer adjustment than $T_{step}$ is achieved in fine step unit 212 to improve the resolution or to reduce the timing error. For the later case, $T_{step}$ can be chosen a larger value (10x for example). Fine step unit 212 can use exactly the same structure as the course step unit 211 with its base delay of each unit cell being a finer value (one 10th of $T_{step}$ for example), or it can be built with a different structure. In any case, it is the digital command code on 232 that also controls the delay of the fine step delay unit 212. Assume for this example, that a total of 10 (2N=2×5=10) coarse step units 211 are used in the delay line. If a coarse step adjustment is applied to every delay unit at the same time, a total delay range adjustment of 10×$T_{step}$ will result for the whole delay line. During power up, delay adjustment can also be applied to the 5 front delay units (21, FIG. 1) and to the 5 rear delay units (21', FIG. 1) for every delay unit pair alternatively. As a result, delay range amount of 5×$T_{step}$ results for the whole delay line in each coarse step during power-up. In preferred embodiment, the delay adjustment also includes the 10×1/10 fine steps range of 212 since all fine step units are adjusted simultaneously. Another requirement for the delay units is a matched rise-to-rise and fall-to-fall delay to ensure a non-distorted pulse width while a pulse is traveling through the delay line. Invertor 213 is used for inverting the polarity of the signal from DLYIN 210 to DLYOUT 220, so for every other delay unit (or a bit time delay) the signal is not inverted and that any mismatches in the rise and fall delays inside the delay unit will be canceled.

With reference to FIG. 1, the digital command from the Up/down Shifter on line 1000 controls each of the delay units 21 and 21' such that the delay of which equals to half of the bit period ($\frac{1}{2}$ Tb), accurate to ± one step in the delay unit, provided that all the delay units are identical and that proper codes are chosen at any particular instance.

Special care has to be taken in circuit layout and placement of the delay units to ensure delay matching.

With reference to FIG. 4(a) the delay detection is performed by "sampling" the level status by a registration process which looks at each monitored node of delay units from BT3 through delay units 501 through 506 of phase detector 50 and 601 of post delay 60. The monitored node is chosen in such a way that the time delay between any two consecutive nodes in any operative condition should be less than $\frac{1}{2}$ Tb. Sampling Register 70 samples the levels of each monitored node at the rising edge of the LCLK to locate the position of the previous LCLK rising edge. Alternatively, the task of locating the position of the previous rising edge could also be accomplished by sequentially setting corresponding RS Flip-Flops which are connected to each of the monitored nodes upon the arrival of the pulse at each monitored node. At the occurrance of the LCLK rising edge, the RS Flip-Flop status can be interrogated to determine the position of the previous rising edge by locating the border between the set and non-set flip-flops.

With respect to the embodiment of FIG. 4(a) if the delay of the delay units is very close to the nominal value of $\frac{1}{2}$ Tb, when a rising edge of LCLK arrives at node 12 on input to Delay Compensation 52, the previous LCLK rising edge should be somewhere around or near the nodes at the interface of delay line 20 and phase detection delay 50, having been delayed the full byte clock period or the delay amount of 2N delay units by the delay line 20. A level change indicating a rising edge position is observed in this region when the levels of the monitored nodes are latched into the D type Flip Flop registers clocked by DTRCK. This region is where the timing or phase difference between the sampling clock DTRCK on line 14 and the various delayed copies of the sampling clock DN(j:1) needs a close examination, and it is called the detection window. Assuming the command code to the Delay units is set correctly such that the delay of the delay units are exactly $\frac{1}{2}$ Tb, we define node WCN, FIG. 4(a) and FIG. 4(b) on the output of delay 503 in the phase detection delay 50 to be the "window center node" where the transition is to occur if the delays are correct when sampling takes place. If the delay of the delay units 21 is not exactly $\frac{1}{2}$ Tb, then the transition will be detected on either the left side (indicating "early") or on the right side (indicating "late") of the window center.

The same type of delay cells used in delay unit 21 is also used in the phase detection delay 50 (501 through 506). The post delay block 60 receives the delayed signal from phase detection delay 50. The delays 601, 602, etc. does not have to be the same type of delay units as in block 50 and in fact, delays with larger delay values are preferred since the function of this delay is to "trap" or keep the delayed "previous" LCLK rising transition within the delay line when the current LCLK rising edge is sampling.

We group the inputs to the sampling register 70 from different nodes of the delay line 20, from Phase Detection Delay 50 and from Post Delay 60 in a bus signal and call it DN(j:1). The outputs from the sampling register 70 are the sampled level status for the above nodes and are called DST(j:1) We can show that a ". . . 111 . . 111000 . . . " type of this status code can be expected near the node where a "0>1" transition is taking place when it is sampling. A ". . . 001110000 . . . " type of status code is seen if the signal pulse width is relatively narrow in respect to the delay amount of the delay line. Note that if the time delay interval between any two adjacent nodes is smaller than the pulse width in any operation conditions, the pulse will be "buried" between the two nodes and the transitions of the pulse will not be seen. The resulting status code in this case will be ". . . 00000 . . . ". Assuming that the command codes are proper, then WCN is the node around which a level change or transition occurs when the sampling register 70 latches the level status into the DFF's. In the event that temperature change or supply power noise causes delay variations so that the delay of the delay units 21 is no longer equal to half of the bit period, or the total delay of delay line 20 (FIG. 1) is no longer equal to the byte period, the transition detected will be on one side of the WCN, giving indications whether the delay of the delay unit 21 is shorter or longer than the nominal value.

FIG. 4(b) shows the waveforms at the input of the sampling register 70 and the status is sampled for different timing conditions. Line 531 shows the status when the delay units are "calibrated" to their nominal value or the delay line is "in-lock." Line 532 shows the status when the sampling clock DTRCK is "early," which is equivalent to when the delay of the delay units is larger than their nominal value such that the previous rising transition or the delayed copy 562 has not arrived at WCN. Line 533 is for the case the sampling clock is "late" so that the transition 563 has passed WCN. The sampled status codes are shown in the matrix of FIG. 4(c). In the "in-lock" condition column, the transition or level status change occurs within −0.5 and +0.5 of WC delay unit range (552). In the "early" condition column, the transition occurred between node DD_2 and DD_1 (indicated by a level difference between SD_2 and SD_1, 533) when the sampling clock is sampling. This indicates that the delay of the delay unit is larger than the nominal value and that the control should decrease the delay of the delay unit. In the "late" condition column, the transition occurred between node DU_1 and DU_2, indicated by a level change 554 between SU_1 and SU_2 when it is sampled. This condition should cause the control to step up to increase the delay value of the delay unit to move the transition back toward the WCN. If the delay of the delay units is very close to its nominal value of ½ Tb, there is a strong probability that signal at WCN will be making a transition when DTRCK is sampling, 561, FIG. 4(b), causing the flip-flop to enter the metastable state. However, since the outputs from the flip-flops DST(J:1) are sampled once every byte, it can allow several bit period times for metastable flip flop resolution, adequate for the output to be settled at one of the two logic states. The addition of the phase detection delay 50 to the delay line 20 is to provide a more detailed look at the window center position. The additional delay caused by delay units 501 through 503, as well as the setup time of the D flip flops in sampling register 70, is to be compensated by the delay compensation block 52 (FIG. 1).

The calibration of the delay unit, in operation, includes two modes, the initial "power-up" mode and the normal operation mode. During power-up, the digital command codes may be set initially to maximum such that the delay of the delay unit is maximum or much larger than the nominal ½ $T_b$ so that fewer delay units are required to delay a byte clock period. The "previous" rising edge or the transition of the sampled level status is found on left side of the window center, or somewhere in delay line 20. The digital command code 1000 can then be decremented quickly to decrease the delay of the delay units to "move" the detected rising edge transition location quickly towards the WCN. This mode is equivalent to the "lock-in" period of the traditional PLL for which smaller loop time constant is desired for fast frequency acquisition.

In normal mode, after the delay line has been calibrated, the delay adjustment through the update of the digital command code will react to changes due to temperature or supply voltage drifts, or other "slow" changes, and will not respond to high frequency changes, or changes caused by high frequency noise. An equivalent "low pass" filter or large "time constant" is preferred for this mode. An obvious advantage of this type of digital solution is that it does not compromise the time constant for the two modes.

FIG. 5 is the block diagram of one embodiment of the Adjust Decision Circuit 80 (FIG. 1.). The inputs to this circuit is the status code outputs from the sampling register DST(j:1) which are provided by the sampling process once every byte cycle. Complex gate 84 performs the function of rising transition detection. Only if the two inputs to the XOR gate 82 are in different logic levels and the one on the left is a logical one, then the output of the AND gate 83 will be high, indicating a "0>1" transition or a rising edge transition detected between the two consecutive nodes 801 and 802. There should be only a single "1" in the XDST(j:1) input bus lines for any sampled code since there is only a single rising edge in the delay line per sampling cycle, if the delay units are calibrated to or close to nominal value of ½ Tb such that the whole delay line 20 delays a time equal to the byte period. If more than one "1" exists in XDST(j:1), a "noise" condition, or a "locked-on-2x" condition (meaning that the delay value of the delay units are close to Tb instead of ½ Tb) is indicated. The Status Decode Logic 85 decodes the status code XDST(j:1) into a 7-line detection code on line 851 through 857.

Figures 6A, 6B:
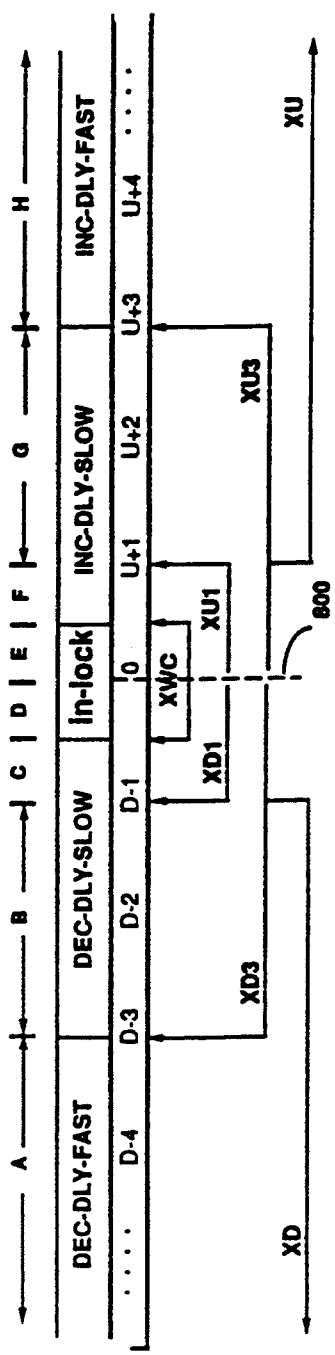
FIGS. 6A and 6B show a functional table of the Adjust Update Control Logic.

FIG. 6(a) illustrates the function of the Status Decode Logic 85. Line 800 indicates the "window center" position. If the detected transition is within the region of −0.5 and +0.5 delay cell from the window center or in the zone D, E, XWC is "1". If the detected transition is in the region of one delay cell on left (right) side of the window center, then XD1 (XU1) is logic "1". If the detected transition is within three delay cells on left (right) of the window center, XD3(XU3) becomes logic "1." If the transition is in the region one delay cells away on left side of the window center XD(XU) is a logic "1." Note the overlaps of the regions. The status of this detection code combination gives the information as where the transition is detected and how fast this detected transition is moving from byte cycle to cycle. Both are useful when implementing a digital filter function. The Adjust Update Control 86, FIG. 5, is not a pure combinatorial logic function, because the output of this circuit is dependent on the current input code combination, and on the history of the input/output. Also, in high speed data communications, the byte clock rate is in the range of ten's of MHz. As a result, the status sampling rate is much higher than the delay variation rate caused by normal temperature drift or supply voltage variation It is necessary to "filter" out the digital "noise" in the status codes, and to ignore the temporary delay changes caused by high frequency power supply noise. Different digital structures can be used to implement the filter function. Generally, the filter function should remove or ignore rapid phase variations caused by rapid electrical noise, while passing the slow and steady phase changes caused by slow delay changes to the controls of the Up/down Shifter 90 to make proper command code adjustment to maintain constant delays of the delay units.

FIG. 6(b) shows a function table for implementing the Adjust Update Control 86, FIG. 5. Columns 801 through 807 are the status code inputs from the Status Decode Logic which is sampled for every byte clock. Columns 808 through 810 are three intermediate variables. Outputs are shown in column 811 through 814 where UD and ROTEN are the control outputs to the Up/down Shifter for delay adjustment. ROTEN=1 enables the adjustment when control update is necessary. UD gives direction indication as how to make adjustment (UD=1 for step up and UD=0 for step down) to increment or decrement the delay of the delay unit. FS is the switching control between Fast adjust mode and Slow adjust mode. RESTART=1 enables a reset process in the event of a consistently detected error status.

With reference to FIG. 6(a) and 6(b), row (a) shows the situation when the detected transition is in zone A, left of XD3, as in the case of power-up. This is the zone for DEC-DLY-FAST mode (UD=0 and FS=1), meaning delay of the delay unit needs to be decremented with large (coarse) step to be reduced fast. This mode corresponds to a smaller time constant as in the PLL case. In row (b) and (c), the detected transition is still on the left side of the window center, so decrementing the delay unit is still necessary. However, assuming the transition is already within +−3 delay units, or +−3x $T_{step}$ from the window center, in zone B and C in FIG. 6(a), no fast adjustment is to be made in this instance since each such adjustment of a delay change of 5x Tstep is too large and may "overshoot" to zone H on other side. This is the zones for DEC-DLY-SLOW mode (UD=0 and FS=0), meaning delay unit decrementing is made with fine steps which correspond to a large time constant as in the PLL case. Row (d) and (e) indicates the IN-LOCK condition, which means that the total delay of the delay line is within +−0.5 $T_{step}$ comparing with the reference byte clock. No adjustment is necessary for this condition (ROTEN=0). Rows (f), (g) and (h) indicate similar situations as in rows (c) (b) and (a) except that the delay of the delay unit needs to be incremented (UD=1) instead. FIG. 6(b) provides a means to understand the overall operation of the adjust update control 86 relative to different zones in which the transition is detected. Row (i) and (j) shows error status in which either transitions are detected on both sides of the window center, or none is detected. These error status could be the result of digital noise in the status sampling process, and should therefore be ignored. The RESTART becomes active only if the errors are persistently detected. Another error status could result if the adjustable range of the delay unit is large enough that it delays time of Tb instead of ½ Tb. A IN-LOCK condition could be erroneously resulted since one transition should be detected in the middle of the delay line 20, while a second transition can be detected around the window center. This is indicated in row (k) of FIG. 6(b) as a LOCKED-ON-2xUC condition, similar to the case in PLL when the PLL is locked on the second harmonics of the reference clock. One solution to this problem is to restart the delay calibration process by setting the control code to the delay units in such a way that all the delay units select minimum delay value as the initial setting. In doing this, the transition is first detected on the right side of the window center to avoid the LOCKED-ON-2xUC condition. Note the "*" in the table in FIG. 6(b), which means the controls become activated only if a certain condition is satisfied. For example, if the last value for UD is "0" (meaning delay decrement) while the current status code changes to XDN=1 and XUP=0 (meaning delay increment), one option is to change UD immediately to "1" if it is in the slow or fine adjustment mode, since only a small step adjustment can be made regardless of how big the delay adjustment is indicated by the detection, just like a fast spike on the phase detector output is "smoothed" by a large capacitor in the low pass filter. On the other hand, if it is in fast adjustment mode while a sudden change in direction is indicated, further detection results may be needed before a reverse direction adjustment is made. In any case, these type of digital filter functions can be implemented to make correct delay adjustment with less timing error or resulting jitter. The preferred Status Decode Logic 85, FIG. 5 is to be implemented according to FIG. 6(a).

Figure 7:
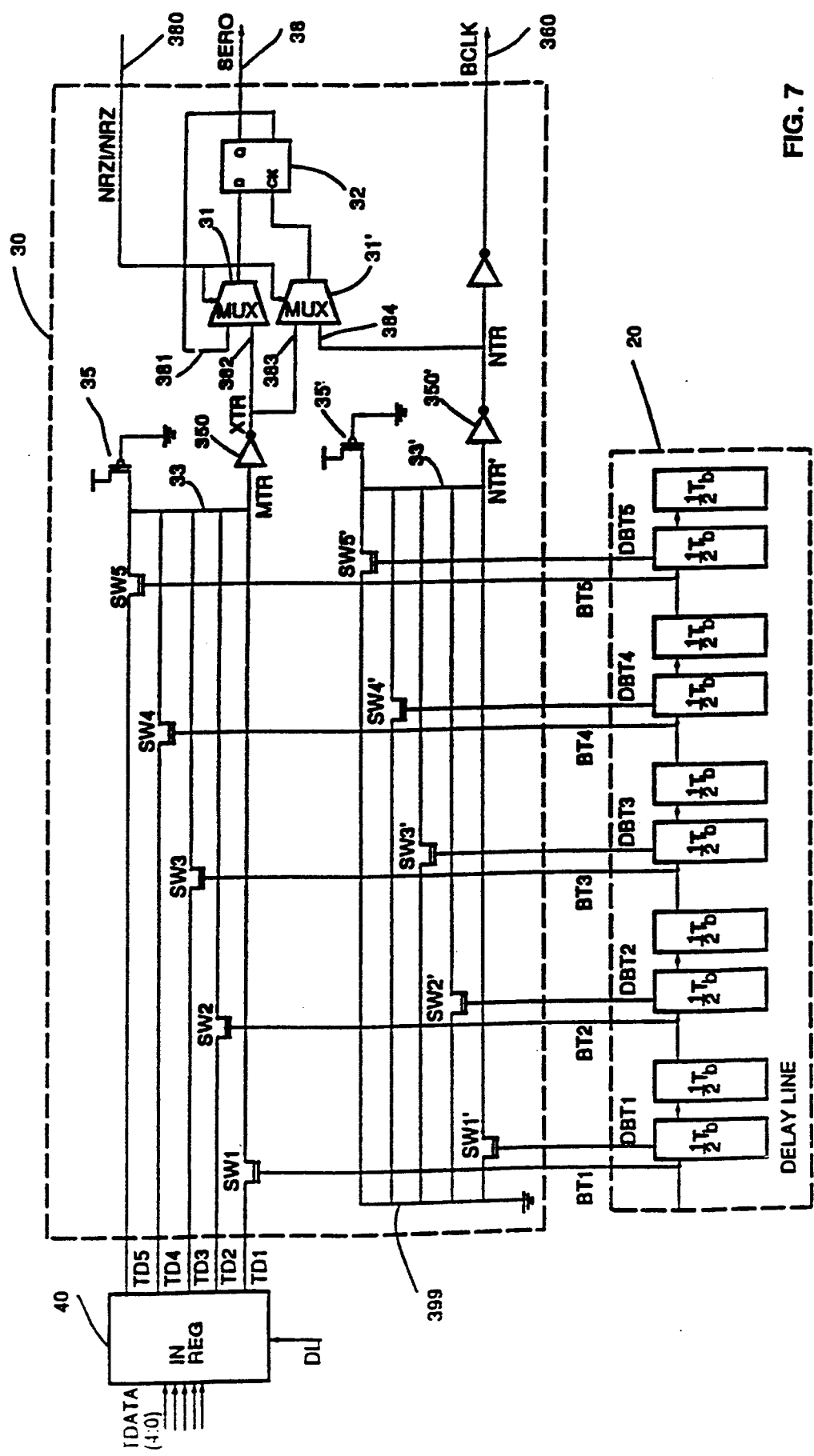
FIG. 7 is an alternative embodiment of the bit serializer portion of the invention.

All of the preceding discussion assumes that the serialized data SERO, FIG. 1, element 38 is transmitted in NRZI format. In the event that the transmitted data needs to be in NRZ format, the Bit Serializer 30, FIG. 1, would need to be modified. FIG. 7 shows one embodiment of a modified Bit Serializer which allows the selection of the transmitted serial data in either NRZI or NRZ format. If NRZI is selected by enabling NRZI/NRZ, 380, input 381 of mux 31 will be enabled to connect the Q_ output of the D flip-flop 32 to its D input to form a T flip-flop. Also when input 383 of mux 31 is enabled, it connects XTR to the clock input of flip-flop 32, providing the NRZI output at SERO, 38, as in block 30, FIG. 1. If NRZ is selected, input 382 of mux 31 will be enabled to connect XTR to the D input of flip-flop 32, while input 384 of mux 31' will be enabled to connect NTR to the clock input of flip flop 32. Since node 399 connects switches SW1' through SW5' to ground, a continuous pulse train will be obtained at node NTR, as shown in FIG. 2(k'). In this mode, signal XTR FIG. 2(i'), is the data input to flip-flop 32, and NTR, FIG. 2(k'), is the clock input to flip-flop 32. NTR is generated by the pulse signal when the pulse exists from DBT1 through DBT5 (which are delayed pulses from BT1 through BT5) to turn on switches SW1' through SW5'. Meanwhile, XTR is generated by the pulse signal when the pulses exist from BT1 through BT5 to turn on SW1 through SW5. It is safe to conclude that the serialized NRZ data at output SERO, 38 from the Q output of flip flop 32, FIG. 2(l), can be reliably obtained if the time delay between BT1 and DBT1 (through BT5 and DBT5) is larger than the setup time of flip flop 32 and smaller than ½ Tb. This can be easily achieved by using proper taps DBT1 through DBT5 from the half bit unit delay as shown in FIG. 7. A clock running at bit rate BCLK can also be available at output 360, which is an inverted signal of NTR, FIG. 2($k'$).

The invention herein has been described in respect to the embodiments of the drawings but other embodiments are contemplated. It is our intention that the scope of the invention is to be controlled by the claims. With this in view, what is claimed is:

1. A digitally regulated time delay circuit comprising a plurality of delay units, each said delay unit calibrated to exhibit a time delay T, where $T \leq Tb$, and Tb is a bit period, each delay unit having an input terminal and an output terminal, said delay units being connected in series;
   means to launch a pulse having a width less than a bit period into said input terminal of one of said plurality of delay units;
   a phase detector, said phase detector being connected to the output of the last of said plurality of delay units, said phase detector having an output, said phase detector comprising,
   (a) a delay line having a plurality of taps,
   (b) a registration means, said registration means coupled to the output of a plurality of said delay units and to each of said phase detector delay line taps, said registration means for determining simultaneously on-the-fly the status of each node to which it is connected and for providing an output indicative thereof, and
   (c) combinatorial and sequential logic means coupled to said registration means output, said combinatorial and sequential logic means providing an output indicative of said delay status, said combinatorial and sequential logic means output being said phase detector output;
   an up/down controller, said up/down controller being connected to and responsive to said phase detector output, said up/down controller providing an output which is a digital command code for control of said delay units; and
   wherein each said plurality of delay units is connected to and responsive to said up/down controller digital command code.

2. The regulated time delay circuit of claim 1 wherein said delay unit comprises a course step unit.

3. The delay circuit of step 2 wherein said coarse step unit includes a MUX, said MUX having one input for receiving one output from each of said delay units, said MUX further having one output.

4. The delay circuit of step 3 wherein one of said MUX inputs is made available at said MUX output and wherein the selection available at said MUX output is responsive to and determined by said digital command code.

5. The circuit of claim 4 wherein said delay unit further includes a fine step unit and wherein said fine step unit has a finer resolution than the resolution of said coarse step unit wherein each coarse step unit and said fine step unit comprise a plurality of serially connected unit cells, wherein said unit cells of said coarse step unit have a first delay and said unit cells of said fine step unit have a second delay and where said second delay is smaller than said first delay and wherein each said delay unit in said fine step unit has an input and output; a second MUX, said second MUX having a sufficient plurality of inputs, one of each of said second MUX inputs being connected to an output of said delay unit of said fine delay step unit.

6. A digital data serializer for high data rate transmission having a bit frequency equal to 1/Tb comprising a first plural stage register for latching a multibit word to be serialized, each said register stage having an output;
   a gating network, said gating network including a plurality of switches, each said switch having an input, output and control terminal, the output terminal of all the said switches coupled to a node and the input terminal of each said switch connected to a different one of said register stage outputs;
   a digitally regulated time delay circuit, comprising a plurality of nominal ½ Tb delay units connected in series from their inputs to their outputs, and
   each control terminal of said gating network switches being connected to a different said input of one of said ½ Tb units.

7. The serializer of claim 6 wherein said node is coupled to a pull up circuit.

8. The serializer of claim 7 including
   means to control the delay in each said ½ Tb delay units, said means including an up/down shifter which issues a digital command code responsive to the extent and sense of the physical position of the instantaneous location of a transition of a pulse moving through said series ½ Tb delay unit with respect to a preselected output of a said ½ Tb delay unit, said preselected output being a nominal window center.

9. The serializer of claim 8 wherein said means to control the delay in each said ½ Tb delay units further includes,
   (a) a sampling register, said sampling register having inputs and output, said inputs being connected to a plurality of said ½ Tb delay units for storing their status on-the-fly, and
   (b) combinatorial and sequential logic means connected to the outputs of said sampling register for providing an analysis of said sampling register outputs indicative of the physical location of the pulse in said delay.

10. An all digital method for regulating a delay line which is transmitting a serial pulse train having a bit frequency equal to 1/Tb comprising
    launching a pulse having a pulse width equal to ½ Tb into said delay line, said delay line including a plurality of serially connected delay units having a nominal delay equal to ½ Tb;
    determining the position of any instant of said pulse in said delay line;
    adjusting said delay of each said ½ Tb delay units responsive to the said position of said pulse in said delay line.

11. The method of claim 10 wherein the step of determining the position at any instant of said pulse includes sampling the output of said plurality of series connected delay elements, and analyzing said sampled output using combinatorial and sequential logic techniques to determine the position of said pulse relative to a reference location.

12. The method of claim 11 wherein the step of adjusting said delay of each said ½ Tb delay units includes generating a digital command code with an up/down shifter responsive to said determination of said pulse position, and controlling the delay of each said delay unit responsive to said digital command code.

* * * * *